(12) United States Patent
Chen et al.

(10) Patent No.: US 10,522,480 B2
(45) Date of Patent: *Dec. 31, 2019

(54) PACKAGING DEVICES AND METHODS OF MANUFACTURE THEREOF

(71) Applicant: Taiwan Semiconductor Manufacturing Company, Ltd., Hsinchu (TW)

(72) Inventors: Hsien-Wei Chen, Hsinchu (TW); Tsung-Yuan Yu, Taipei (TW); Ming-Da Cheng, Jhubei (TW); Wen-Hsiung Lu, Jhonghe (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/133,378

(22) Filed: Sep. 17, 2018

(65) Prior Publication Data

US 2019/0019765 A1 Jan. 17, 2019

Related U.S. Application Data

(60) Continuation of application No. 15/169,177, filed on May 31, 2016, now Pat. No. 10,079,213, which is a
(Continued)

(51) Int. Cl.
*H01L 23/00* (2006.01)
*H01L 23/58* (2006.01)
(Continued)

(52) U.S. Cl.
CPC ............ *H01L 23/562* (2013.01); *H01L 21/56* (2013.01); *H01L 21/78* (2013.01); *H01L 23/544* (2013.01); *H01L 23/585* (2013.01); *H01L 24/02* (2013.01); *H01L 24/03* (2013.01); *H01L 24/05* (2013.01); *H01L 24/13* (2013.01); *H01L 24/96* (2013.01); *H01L 23/3114* (2013.01); *H01L 2223/5446* (2013.01); *H01L 2224/02331* (2013.01); *H01L 2224/0391* (2013.01); *H01L 2224/0401* (2013.01); *H01L 2224/05008* (2013.01); *H01L 2224/05548* (2013.01); *H01L 2224/13* (2013.01); *H01L 2224/13022* (2013.01); *H01L 2224/13024* (2013.01);
(Continued)

(58) Field of Classification Search
CPC ... H01L 23/562; H01L 23/544; H01L 23/585; H01L 21/56; H01L 21/78
See application file for complete search history.

(56) References Cited

U.S. PATENT DOCUMENTS 6,324,069 B1 11/2001 Weber
6,326,701 B1 12/2001 Shinogi et al.
(Continued)

*Primary Examiner* — Tucker J Wright
*Assistant Examiner* — Wilner Jean Baptiste
(74) *Attorney, Agent, or Firm* — Slater Matsil, LLP

(57) ABSTRACT

Packaging devices and methods of manufacture thereof for semiconductor devices are disclosed. In some embodiments, a method of manufacturing a packaging device includes forming an interconnect wiring over a substrate, and forming conductive balls over portions of the interconnect wiring. A molding material is deposited over the conductive balls and the substrate, and a portion of the molding material is removed from over scribe line regions of the substrate.

20 Claims, 6 Drawing Sheets

Related U.S. Application Data division of application No. 14/180,192, filed on Feb. 13, 2014, now Pat. No. 9,355,906.

(60) Provisional application No. 61/777,691, filed on Mar. 12, 2013.

(51) Int. Cl.
| | | |
|---|---|---|
| *H01L 21/78* | (2006.01) | |
| *H01L 21/56* | (2006.01) | |
| *H01L 23/544* | (2006.01) | |
| *H01L 23/31* | (2006.01) | |

(52) U.S. Cl.
CPC .. *H01L 2224/94* (2013.01); *H01L 2924/3512* (2013.01); *H01L 2924/35121* (2013.01); *H01L 2924/3656* (2013.01)

(56) References Cited

U.S. PATENT DOCUMENTS

| | | |
|---|---|---|
| 6,943,375 B2 | 9/2005 | Yang |
| 2003/0129541 A1 | 7/2003 | Weng |
| 2004/0027788 A1 | 2/2004 | Chiu et al. |
| 2004/0192024 A1 | 9/2004 | Ito |
| 2005/0020047 A1 | 1/2005 | Mis et al. |
| 2006/0038291 A1 | 2/2006 | Chung |
| 2006/0273467 A1 | 12/2006 | Brandenburg et al. |
| 2010/0072635 A1 | 3/2010 | Kuo et al. |
| 2011/0198753 A1 | 8/2011 | Holland |
| 2011/0278722 A1 | 11/2011 | Miki |
| 2013/0341800 A1 | 12/2013 | Tu et al. |

PACKAGING DEVICES AND METHODS OF MANUFACTURE THEREOF

PRIORITY CLAIM AND CROSS-REFERENCE

This application is a continuation of U.S. patent application Ser. No. 15/169,177, filed May 31, 2016, and entitled "Packaging Devices and Methods of Manufacture Thereof," which is a divisional of U.S. patent application Ser. No. 14/180,192, filed on Feb. 13, 2014, and entitled "Packaging Devices and Methods of Manufacture Thereof," now U.S. Pat. No. 9,355,906, issued May 31, 2016, which claims priority to U.S. Provisional Application Ser. No. 61/777,691, filed on Mar. 12, 2013, entitled "Packaging Devices and Methods of Manufacture Thereof," which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies also require smaller packages that utilize less area than packages of the past, in some applications.

One type of smaller packages for semiconductor devices that has been developed are wafer level packages (WLPs), in which integrated circuits are packaged in packages that typically include a redistribution layer (RDL) or post passivation interconnect (PPI) that is used to fan-out wiring for contact pads of the package so that electrical contacts can be made on a larger pitch than contact pads of the integrated circuit. WLPs are often used to package integrated circuits (ICs) demanding high speed, high density, and greater pin count, as examples.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to packaging devices for semiconductor devices and methods of manufacture thereof. Novel packaging devices will be described herein that include a thinned molding material disposed over at least scribe line regions of the packaging devices. The molding material is also thinned in seal ring regions and integrated circuit regions of the packaging devices in some embodiments. The thinned molding material regions improve sawing accuracy during singulation of the packaging devices and increase assembly yields.

Figure 1:
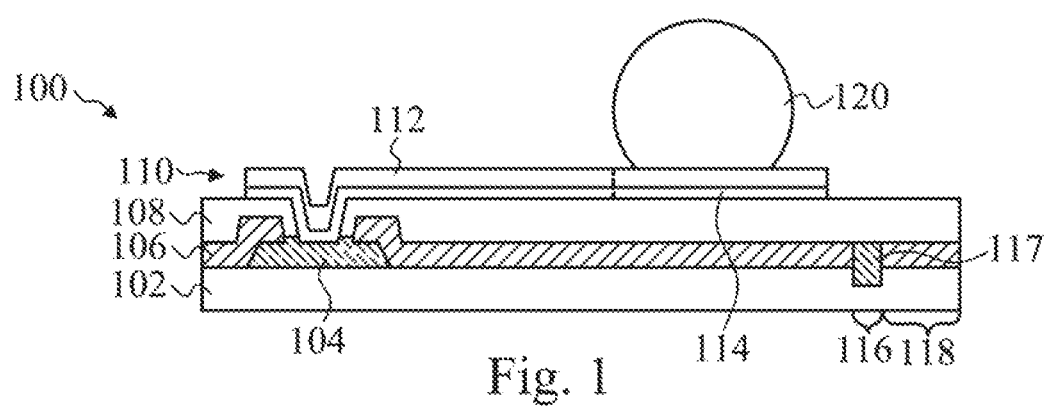
FIGS. 1 through 4 and 15 are cross-sectional views illustrating a portion of a packaging device at various stages of manufacturing in accordance with some embodiments of the present disclosure.

FIGS. 1 through 4 are cross-sectional views illustrating a portion of a packaging device 100 at various stages of manufacturing in accordance with some embodiments of the present disclosure. The packaging device 100 comprises a WLP in some embodiments. Referring first to FIG. 1, to manufacture the packaging device 100, a substrate 102 is provided. The substrate 102 may comprise silicon, other types of bulk semiconductor material, or other materials, as examples. The substrate 102 may include one or more integrated circuits formed thereon, not shown. The substrate 102 comprises a plurality of integrated circuit regions in some embodiments, for example. The integrated circuit regions may contain active and passive devices, conductive layers, and dielectric layers according to the electrical design of the integrated circuits, as examples.

Figure 6:
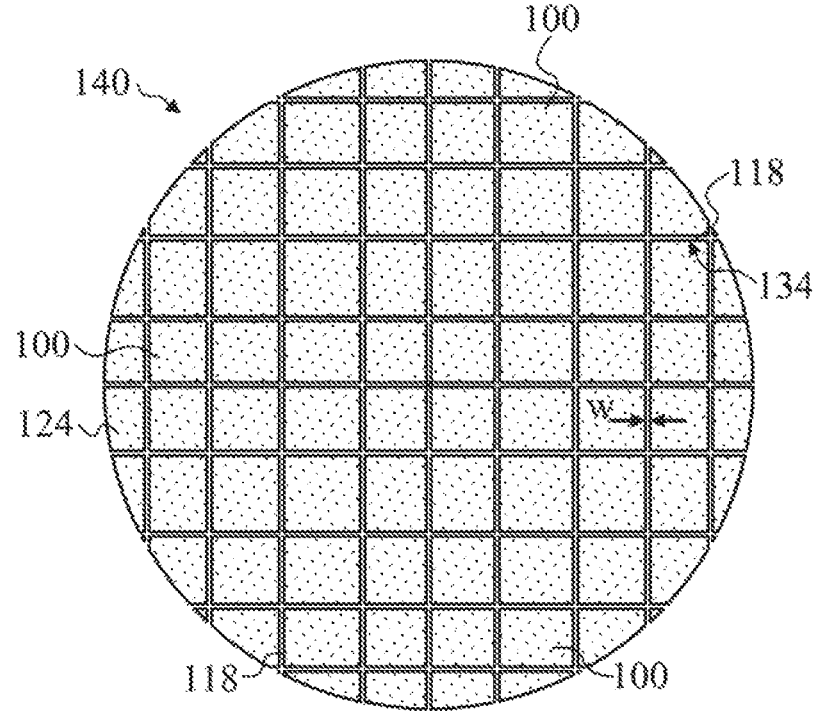
FIG. 6 is a top view of a wafer comprising a plurality of packaging devices in accordance with some embodiments.

A plurality of packaging devices 100 is formed across the surface of the substrate 102 in accordance with some embodiments, as shown in a top view in FIG. 6. The packaging devices 100 are formed over the substrate 102 when the substrate 102 is in a wafer 140 form.

Referring again to FIG. 1, each of the plurality of packaging devices 100 includes a seal ring region 116 disposed around a perimeter thereof in some embodiments. The seal ring region 116 includes a seal ring 117 disposed within the substrate 102. A portion of the seal ring 117 is also disposed over a surface of the substrate 102 in some embodiments, as shown in FIG. 1. The substrate 102 includes a scribe line region 118 disposed around a perimeter of the seal ring 117 of each of the plurality of packaging devices 100. The seal ring regions 116 are disposed proximate the scribe line regions 118, for example. The seal ring regions 116 and scribe line regions 118 are disposed at the edges of each packaging device 100 on the substrate 102.

A conductive layer is formed over the substrate 102 as a contact pad 104 using a patterning and deposition process over the substrate 102. The contact pad 104 may comprise aluminum (Al), copper (Cu), tin (Sn), nickel (Ni), gold (Au), silver (Ag), other electrically conductive materials, or multiple layers or combinations thereof, as examples. The contact pad 104 may be formed using an electrolytic plating or electro-less plating process, for example. A plurality of the contact pads 104 (not shown) are formed over the surface of the substrate 102, and the contact pads 104 may be of the same size or of different sizes. The seal ring 117 may comprise the same material as the contact pad 104 and may be formed from the same conductive layer as the contact pad 104 in some embodiments. The seal ring 117 may alternatively comprise other materials.

A passivation layer 106 may be formed over the surface of the substrate 102 and over the top surface of the contact pad 104 and substrate 102 for structural support and physical isolation. The passivation layer 106 comprises silicon nitride (SiN), silicon dioxide ($SiO_2$), silicon oxynitride (SiON), polyimide (PI), benzocyclobutene (BCB), polybenzoxazole (PBO), other insulating materials, or combinations or multiple layers thereof, as examples. An opening in the passivation layer 106 may be made by removing a portion of passivation layer 106 using a mask-defined photoresist etching process to expose a portion of the contact pad 104, while leaving another portion of the contact pad 104 covered.

A polymer layer 108 may be formed on the passivation layer 106, following the contour of the passivation layer 106 and filling a part of the opening of the passivation layer 106 over the contact pad 104. The polymer layer 108 may not completely fill the opening of the passivation layer 106 over the contact pad 104; rather, it may be patterned to form an opening to expose a portion of the contact pad 104, while covering other portions of the contact pad 104. The patterning of the polymer layer 108 may include photolithography techniques. The polymer layer 108 may be formed of a polymer, such as an epoxy, polyimide, benzocyclobutene (BCB), polybenzoxazole (PBO), and the like, although other relatively soft, often organic, dielectric materials may also be used. Spin coating or other commonly used formation methods may be used to apply the polymer layer 108. The thickness of the polymer layer 108 may be between about 5 μm and about 30 μm, for example. Alternatively, the polymer layer 108 may comprise other dimensions.

A conductive material such as a metal is used to form interconnect wiring 110 over the polymer layer 108, following the contour of the polymer layer 108. The interconnect wiring 110 comprises a post-passivation interconnect in some embodiments. The post-passivation interconnect (PPI) includes a PPI line 112 and a PPI pad 114 which are disposed over the polymer layer 108. The PPI line 112 and PPI pad 114 may have a thickness of less than about 30 μm, and may comprise a thickness of about 2 μm to about 10 μm in some embodiments, as examples. The PPI line 112 and PPI pad 114 may comprise a metal such as Ti, Al, Ni, nickel vanadium (NiV), Cu, or combinations or multiple layers thereof, as examples. The PPI line 112 and PPI pad 114 may be formed using electrolytic plating, electro-less plating, sputtering, chemical vapor deposition methods, and/or photolithography processes, for example. The PPI line 112 and PPI pad 114 may comprise a single layer or multiple layers (e.g., the PPI line 112 and PPI pad 114 comprise two layers in the embodiments shown) using an adhesion layer of Ti, TiW, Cr, or other materials, for example. Alternatively, the PPI line 112 and PPI pad 114 may comprise other materials and dimensions, and may be formed using other methods. The substrate 102 is connected to a number of PPI lines 112 and PPI pads 114 to form a network (not shown) of PPI lines 112 and PPI pads 114, which may electrically connect to the contact pads 104 of the substrate 102, for example.

In some embodiments, a blanket coating of conductive material may be formed over the polymer layer 108 and the exposed portion of the contact pad 104, and the conductive material is patterned using lithography, e.g., by forming a layer of photoresist (not shown) over the conductive material, patterning the photoresist, and using the photoresist as an etch mask during an etch process for the conductive material, forming the conductive material into the desired patterns and shapes of the PPI lines 112 and PPI pads 114. The layer of photoresist is then removed. In other embodiments, a seed layer (also not shown) is formed over the polymer layer 108 and exposed portion of the contact pad 104, and a layer of photoresist is formed over the seed layer. The photoresist is patterned with the desired patterns and shapes of the PPI lines 112 and PPI pads 114. The conductive material is then plated onto the seed layer through the patterns in the photoresist. The photoresist is removed, and the seed layer is removed from over the polymer layer 108. Alternatively, other methods may be used to form the PPI lines 112 and PPI pads 114. In some embodiments, the PPI lines 112 and PPI pads 114 are simultaneously formed and are integral to one another; e.g., the PPI lines 112 and PPI pads 114 are formed from a single piece or the same layer or layers of conductive material.

Only one PPI line 112 and PPI pad 114 are shown in the drawings; however, a plurality of PPI lines 112 and PPI pads 114 are formed across a surface of the packaging device 100 and are used for making electrical connections to a plurality of contact pads 104 disposed over the substrate 102. The PPI lines 112 and PPI pads 114 comprise a redistribution layer (RDL), post-passivation interconnect, or other interconnect routing structure of the packaging device 100 in some embodiments, for example.

The PPI line 112 is a conductive line that extends over the underlying contact pad 104. The PPI line 112 fills an opening in the polymer layer 108 and the passivation layer 106 and forms an electrical connection with the contact pad 104. The PPI line 112 contacts the PPI pad 114. The PPI line 112 may have a narrow, wide, or tapered shape. The PPI line 112 may comprise a substantially constant thickness and width. The PPI line 112 terminates at the PPI pad 114; therefore, the bodies of the PPI line 112 and the PPI pad 114 may be formed as one piece.

A solder flux (not shown) may be applied to the PPI line 112 and PPI pad 114 in some embodiments to assist in the flow of the solder, such that a subsequently formed conductive ball 120 makes good physical and electrical contact with the PPI pad 114. The flux may be applied by brushing, spraying, a stencil, or other methods, as examples. The flux generally has an acidic component that removes oxide barriers from the solder surfaces, and an adhesive quality that helps to prevent an integrated circuit from moving on the substrate 102 surface during the packaging process using the packaging device 100.

A conductive ball 120 is formed over the PPI pad 114. The PPI pad 114 is used to connect to the conductive ball 120, forming a connection between the contact pad 104 to the conductive ball 120 by way of the PPI line 112 and the PPI pad 114. The conductive ball 120 may have a larger diameter than the diameter or width of the PPI pad 114.

The conductive ball 120 comprises a eutectic material and may comprise a solder bump or a solder ball, as examples. The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductive balls 120 such as solder balls may be formed from SnCu compounds as well, without the use of silver (Ag). Alternatively, lead-free solder connectors may include tin and silver, Sn—Ag, without the use of copper. The conductive ball 120 may be one among an array of the conductive balls 120 formed as a grid, referred to as a "ball grid array" or "BGA", as shown in a top view in FIG. 7. The conductive balls 120 may alternatively be arranged in other shapes. The conductive balls 120 may also comprise non-spherical conductive connectors, for example.

Referring again to FIG. 1, the conductive ball 120 is attached in some embodiments using a solder ball drop process. The conductive ball 120 is mounted onto the PPI pad 114, and the eutectic material of the conductive ball 120 is re-flowed to attach the conductive ball 120 to the PPI pad 114.

Figure 2:
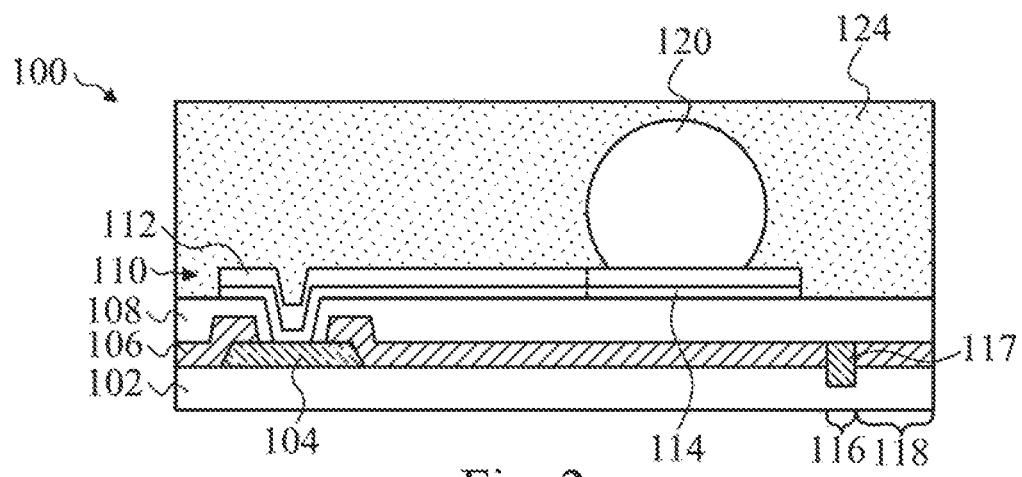

Referring next to FIG. 2, a molding material 124 is then formed and/or deposited over the PPI line 112, PPI pad 114, conductive ball 120, and exposed portions of the polymer layer 108 in some embodiments. The molding material 124 comprises a molding compound and may comprise epoxy, an organic polymer, or a polymer with a silica-based filler added, as examples. In some embodiments, the molding material 124 comprises a liquid molding compound (LMC) that is a gel type liquid when applied. Alternatively, the molding material 124 may comprise other insulating materials. The molding material 124 extends over a top surface of the conductive ball 120 after applying the molding material 124, as shown in FIG. 2.

Figure 4:
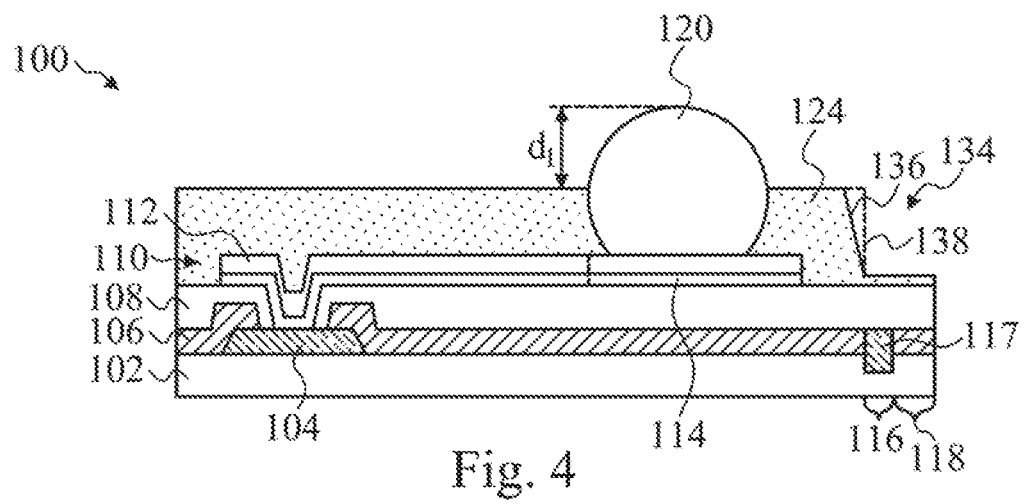

A top portion of the molding material 124 is recessed so that a top portion of the conductive ball 120 is exposed, as shown in FIG. 4. A portion of the molding material 124 is also removed at least from over the scribe line regions 118, also shown in FIG. 4. More molding material 124 is removed from over at least the scribe line regions 118 than proximate the conductive ball 120 in some embodiments, to be described further herein.

After the molding material 124 is applied or deposited as shown in FIG. 2, the molding material 124 is cured. In some embodiments, the molding material 124 shrinks during the curing process, which partially recesses the molding material 124. Additional molding material 124 is removed in some embodiments using a plasma treatment process or other type of process, to remove the molding material 124 from the conductive ball 120 to expose the conductive ball 120, for example.

Figure 3:
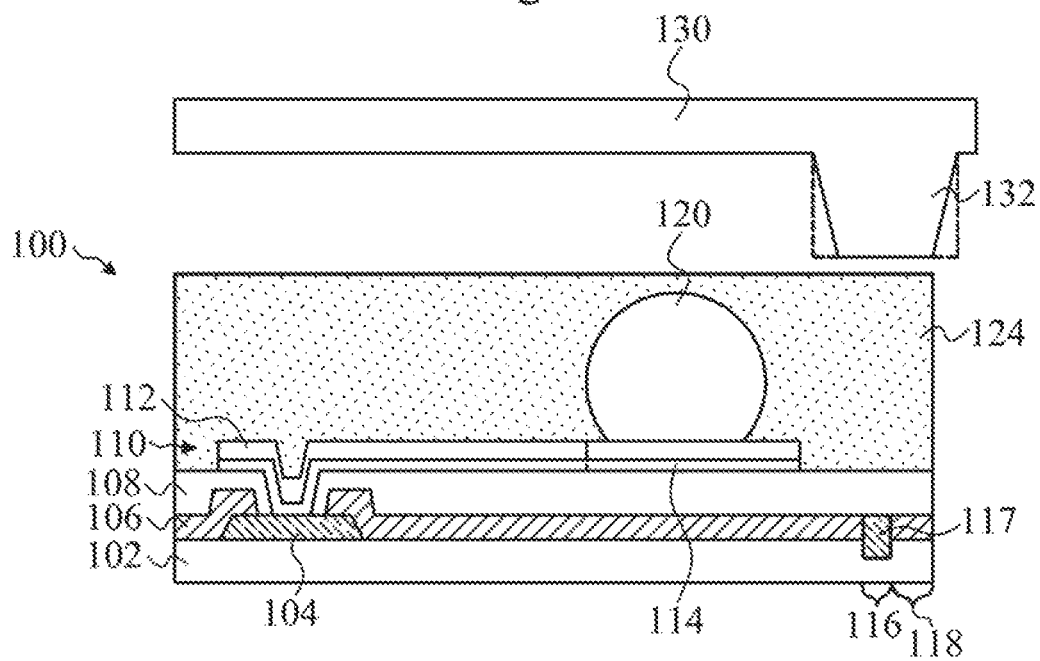

In some embodiments, a portion of the molding material 124 is removed from over at least the scribe line regions 118 using a photolithography process, a laser process, or a molding clamp 130 shown in FIG. 3 that includes a plurality of downwardly extending members 132 formed thereon, as examples. Other methods may alternatively be used to remove the portion of the molding material 124 from over at least the scribe line regions 118.

For example, in a photolithography process, a layer of photoresist (not shown) is formed over the molding material 124 shown in FIG. 2, and the layer of photoresist is patterned by exposure to light or energy reflected from or transmitted through a lithography mask having a desired pattern thereon. The photoresist is developed, and exposed (or unexposed, depending on whether the photoresist is positive or negative) portions of the photoresist are ashed and/or etched away, leaving a patterned photoresist on the molding material 124. The photoresist is then used as an etch mask during an etching process while portions of the molding material 124 are etched away. The etching process may be timed to leave a predetermined amount of the molding material 124 disposed over the top surface of at least the scribe line regions 118 in some embodiments, for example. In other embodiments, all of the molding material 124 may be removed from at least the scribe line region 118, as shown in a cross-sectional view in FIG. 9.

Referring again to FIG. 3, in embodiments wherein a molding clamp 130 is used to remove the molding material 124 from at least over the scribe line regions 118, the molding clamp 130 includes a plurality of downwardly extending members 132 formed thereon. The members 132 are disposed on the molding clamp 130 such that the members 132 fit around the perimeters of each of the packaging devices 100 on the substrate 102. The members 132 comprise tapered sidewalls as shown in FIG. 3, or the members 132 may comprise substantially straight sidewalls as shown in phantom (e.g., in dashed lines) in FIG. 3, as examples. Alternatively, the members 132 may comprise other shapes. The molding clamp 130 comprises a custom molding clamp 130 that is designed to include the downwardly extending members 132 in some embodiments, for example.

The molding clamp 130 is coupled to the substrate 102 or coupled to a support the substrate 102 is placed upon while the molding material 124 is still in a gel liquid state in some embodiments. In other embodiments, the molding clamp 130 is coupled to the substrate 102 or to the support, and then the molding material 124 is applied to the substrate 102. The downwardly extending members 132 displace the molding material 124 in at least the scribe line regions 118, so that a portion of the molding material 124 is removed from over the scribe line regions 118. The molding clamp 130 may be left remaining during a curing process for the molding material 124 and during a plasma treatment process or other process for the molding material 124 used to expose the conductive balls 120 in some embodiments, for example. The conductive balls 120 extend beyond a surface of the molding material 124 by a dimension $d_1$ that comprises about 80 μm to about 120 μm in some embodiments, as shown in FIG. 4. Alternatively, dimension $d_1$ may comprise other values.

In some embodiments, the molding material 124 is also removed from over the seal ring regions 116 of the substrate 102, also shown in FIG. 4. Region 134 comprises a region of molding material 124 with a decreased thickness in accordance with some embodiments. Region 134 is disposed over the scribe line regions 118 and also over the seal ring regions 116 in the embodiment shown in FIG. 4. In other embodiments, region 134 is disposed only over the scribe line regions 118, not shown in the drawings. Region 134 comprises markings in the molding material 124 that comprise traces in a top view of the molding material 124, for example.

Region 134 formed within the molding material 124 comprises substantially a same shape as the downwardly extending members 132 of the molding clamp 130 shown in FIG. 3. For example, in embodiments wherein the molding clamp 130 has tapered sidewalls, the molding material 124 has tapered sidewalls 136 in region 134. In embodiments wherein the molding clamp 130 has substantially straight sidewalls, the molding material 124 has substantially straight sidewalls 138 in region 134, as shown in phantom in FIG. 4.

Referring again to FIG. 2 and FIG. 4, in some embodiments, a first portion of the molding material 124 is removed from over the scribe line region 118, and a second portion of the molding material 124 is removed from over the conductive balls 120. The first portion is greater than the second portion.

Figure 5:
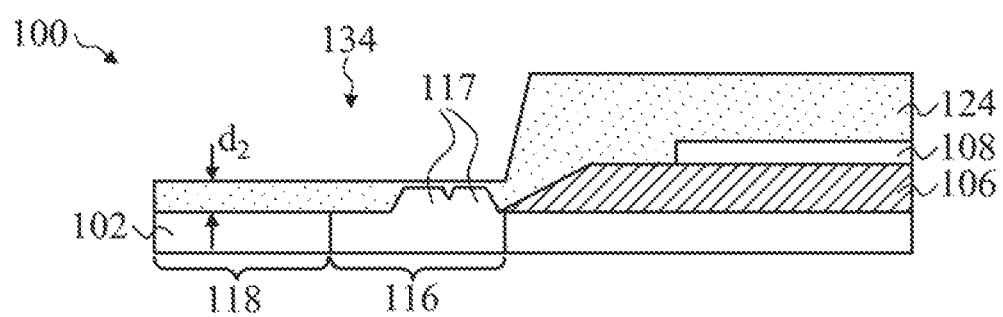
FIG. 5 is a cross-sectional view of a portion of a packaging device in accordance with some embodiments.

FIG. 5 is a cross-sectional view of a portion of a packaging device 100 in accordance with some embodiments. An edge of the packaging device 100 is shown. A seal ring region 116 is shown having two seal rings disposed around a perimeter of the packaging device 100. An amount of the molding material 124 left disposed over the scribe line region 118 and a portion of the seal ring region 116 comprises dimension $d_2$ in some embodiments, wherein dimension $d_2$ comprises about 30 μm or less in some embodiments, for example. In other embodiments, dimension $d_2$ comprises about 20 μm or less, as another example. Alternatively, dimension $d_2$ may comprise other values.

Figure 15:
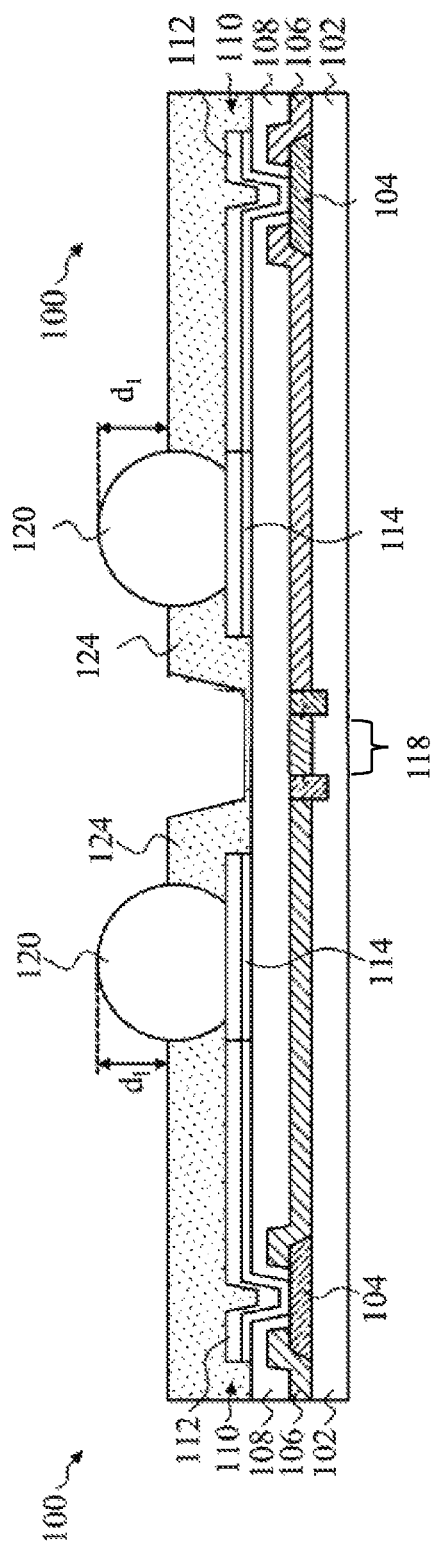

FIG. 6 is a top view of a wafer 140 comprising a plurality of packaging devices 100 in accordance with some embodiments. FIG. 15 is a cross sectional view of the wafer 140 comprising the plurality of packaging devices 100 in accordance with some embodiments. The recessed regions 134 in the molding material 124 comprise traces that run along an entire length of the scribe line regions 118 (and also the seal ring regions 116 in some embodiments) in a horizontal and vertical direction in some embodiments that are visible in the top view. The recessed regions 134 comprising the traces comprise a width w in the top view that is greater than or equal to about (a width of the scribe line region+a width of the seal ring region)*2 in some embodiments, for example. Each recessed region 134 comprises a trace that extends over a scribe line region 118 and two seal ring regions 116 of two adjacent packaging devices 100 in some embodiments, as another example. In some embodiments, the recessed regions 134 may comprise a width that is less than a width of a scribe line region 118, depending on a dimension or length of the downwardly extending members 132 of the molding clamp 130 or the other device or process used to form the recessed regions 134 in the molding material 124, as yet another example.

After the completion of the manufacturing process for the packaging devices 100, the substrate 102 (not shown in FIG. 6; see FIGS. 1 through 4) is singulated along the scribe lines 118 to form a plurality of the packaging devices 100. The substrate 102 may be singulated using a mechanical saw, laser saw, or other means, as examples. The recessed regions 134 in the molding material 124 advantageously improve the accuracy of the singulation process by providing an alignment reference and guide for the tool used to perform the singulation.

In some embodiments, the scribe line regions 118 comprise a sacrificial portion of the substrate 102 that is substantially or completely removed during the singulation process, for example. Thus, the scribe line regions 118 may not remain on a finished packaging device 100 in some embodiments. In other embodiments, portions of the scribe line regions 118 are left remaining on the finished packaging device 100. Portions of or all of the seal ring regions 116 may also be removed during the singulation process, or portions of or all of the seal ring regions 116 may be left remaining on the finished packaging devices 100, for example.

Figure 7:
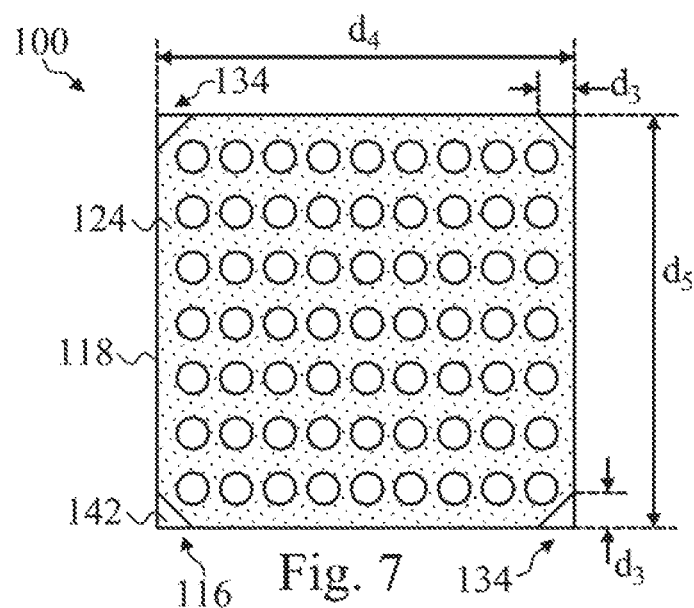
FIGS. 7 and 8 are top views illustrating packaging devices in accordance with some embodiments.
Figure 8:
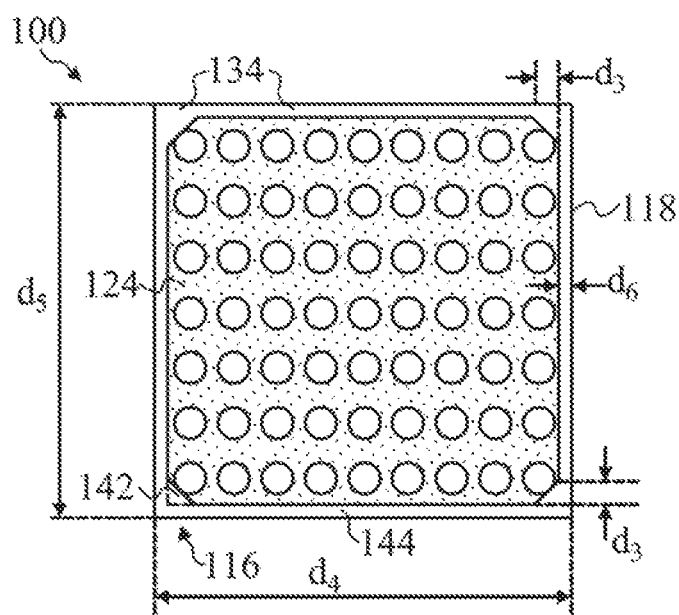

FIGS. 7 and 8 are top views illustrating packaging devices 100 in accordance with some embodiments. FIG. 7 illustrates some embodiments wherein the recessed regions 134 in the molding material 124 are formed in corners 142 of the scribe line regions 118 or in corners 142 of both the scribe line regions 118 and the seal ring regions 116. The recessed regions 134 are only formed in the corners 142 in the embodiments shown in FIG. 7: the recessed regions 134 do not extend horizontally and vertically along the scribe line regions 118, the seal ring regions 116, or an integrated circuit region of the packaging device 100. The molding material 124 width removed in the corners 142 comprises dimension $d_3$ from an edge of the packaging device 100 wherein dimension $d_3$ comprises about 200 μm or less in some embodiments. The packaging device 100 comprises a width comprising dimension $d_4$, and a length comprising dimension $d_5$, wherein dimensions $d_4$ and $d_5$ comprise about 2 mm to about 20 mm in some embodiments. Alternatively, dimensions $d_3$, $d_4$, and $d_5$ may comprise other values. In some embodiments, dimension $d_3$ is greater than or equal to about ($\frac{1}{40}*d_4$ or $\frac{1}{40}*d_5$), for example. Alternatively, dimension $d_3$ may comprise other values relative to dimensions $d_4$, and $d_5$, for example.

FIG. 8 illustrates some embodiments of the present disclosure wherein the recessed regions 134 are formed in the molding material 124 in the corners 142 as described for the embodiments shown in FIG. 7, and the recessed regions 134 are also formed in the molding material 124 fully extending horizontally and vertically along the scribe line regions 118. In some embodiments, the recessed regions 134 are also formed in the molding material 124 fully extending horizontally and vertically along the seal ring regions 116. In yet other embodiments, the recessed regions 134 are also formed in the molding material 124 fully extending horizontally and vertically along an integrated circuit region 144, as shown in FIG. 8. A width of the fully extending horizontally and vertically recessed regions 134 comprises dimension $d_6$, wherein dimension $d_6$ comprises about 100 μm or less in some embodiments, for example. Alternatively, dimension $d_6$ may comprise other values.

In other embodiments, the molding material 124 is not thinned in the corners 142 of the packaging devices 100, as illustrated in the top view of the wafer 140 shown in FIG. 6. The molding material 124 may also be thinned over integrated circuit regions 144 of the packaging devices 100 in the embodiments shown in FIG. 6, for example.

Figure 9:
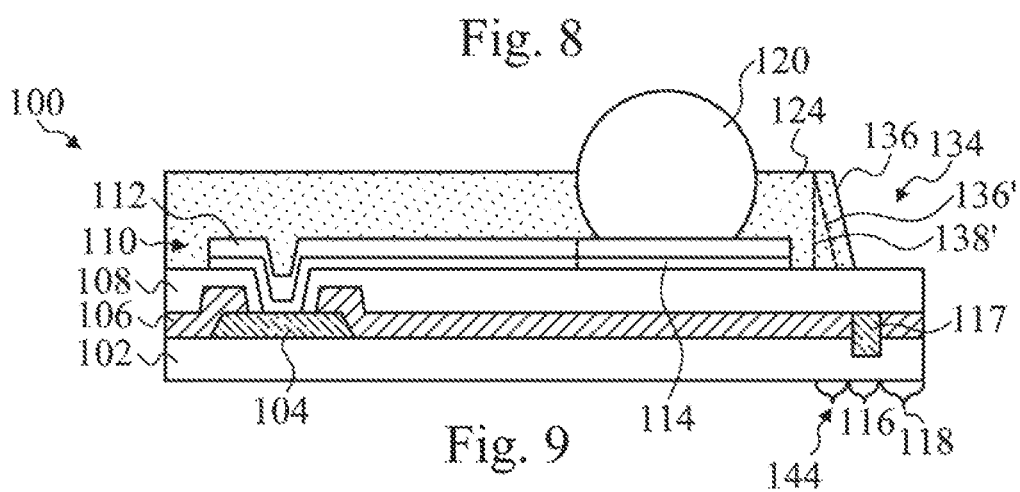
FIG. 9 is a cross-sectional view of a portion of a packaging device in accordance with some embodiments.

FIG. 9 illustrates a cross-sectional view of a portion of a packaging device 100 in accordance with some embodiments. All of the molding material 124 is removed from over the scribe line regions 118 and the seal ring regions 116 of the substrate 102 in region 134. In some embodiments, some or all of the molding material 124 may also be removed from over an integrated circuit region 144 of the substrate 102, also illustrated in FIG. 9 in phantom at 136' and 138'. The recessed region 134 may include molding material 124 having tapered sidewalls 136' proximate the integrated circuit region 144, or the region 134 may include molding material 124 having substantially straight sidewalls 138' proximate the integrated circuit region 144, depending on the shape of the downwardly extending members 132 of the molding clamp 130 or other device or process used to form the recessed regions 134 in the molding material 124, for example. The integrated circuit region 144 is illustrated in FIG. 9 as being adjacent the seal ring region 116; alternatively, the molding material 124 may be thinned in an integrated circuit region 144 that is not adjacent the seal ring region 116 or the scribe line region 118, not shown in the drawings.

Figure 10:
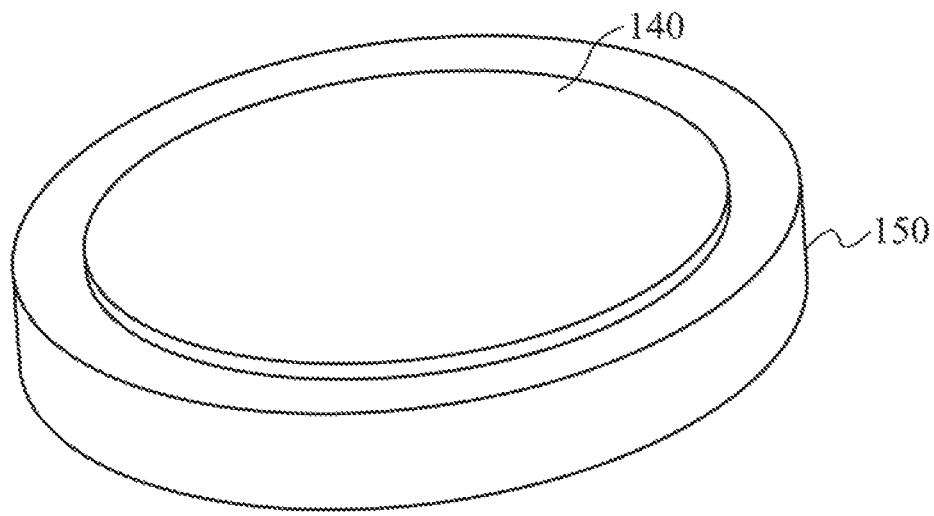
FIGS. 10 and 11 are perspective views illustrating an application of a molding clamp over a wafer comprising a plurality of packaging devices in accordance with some embodiments.
Figure 11:
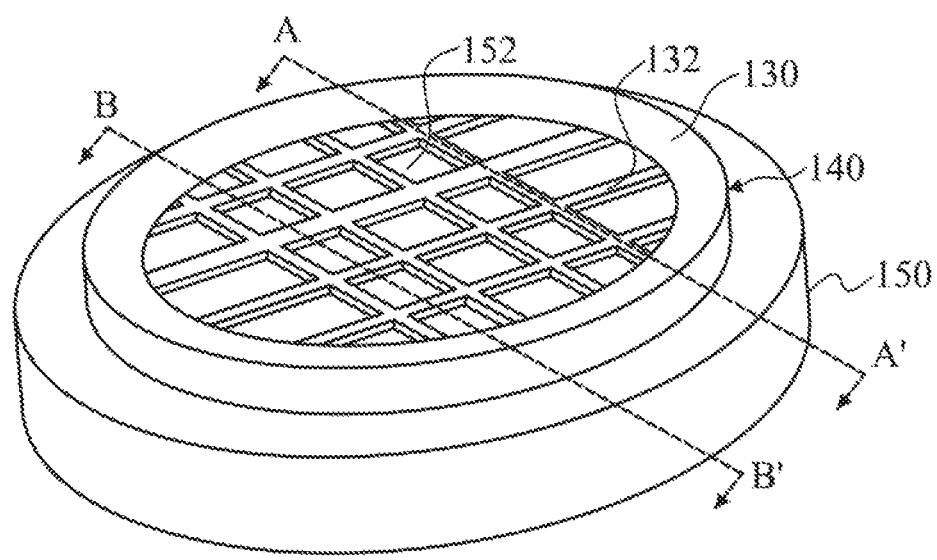

FIGS. 10 and 11 are perspective views illustrating an application of a molding clamp 130 over a wafer 140 comprising a plurality of the packaging devices 100 in accordance with some embodiments. The wafer 140 is placed on a support 150, as shown in FIG. 10. The support 150 is shown as circular in FIG. 10; alternatively, the support 150 may comprise other shapes, such as a square, rectangular, or polygonal, as examples.

The molding clamp 130 is placed over the wafer 140, as shown in FIG. 11. The downwardly extending members 132 have windows 152 disposed between them so that an IC mounting region of the packaging devices 100 is visible through the windows 152. The windows 152 allow the packaging devices 100 to remain exposed during the curing and plasma treatment of the molding material 124, and also allow integrated circuits and/or printed circuit boards (PCBs) to be attached to the conductive balls 120 of the packaging devices 100 while the clamp 130 is attached to the wafer 140 in some embodiments, for example. After the integrated circuits or PCBs are mounted on the packaging devices 100, the wafer 140 is then singulated along the scribe line regions 118. In other embodiments, the wafer 140 is singulated without first mounting integrated circuits or PCBs on the packaging devices 100, for example.

The molding clamp 130 may comprise a metal, polymer-based material, or other materials. The molding clamp 130 may be round as illustrated in FIG. 11, and may fit completely around the edges of the wafer or may be attached by clamps (not shown) to the wafer 140 and/or support 150. The molding clamp 130 may alternatively comprise other shapes, such as a square, rectangle, polygon, or other shapes, and the molding clamp 130 may be attached to the wafer 140 or support 150 using other means.

Figure 12:
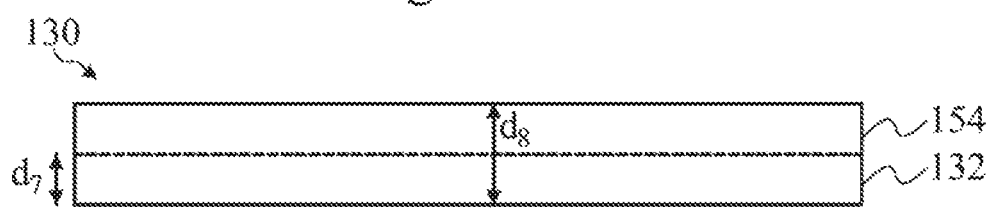
FIG. 12 is a cross-sectional view of a portion of the molding clamp at view A-A' shown in FIG. 11.
Figure 13:
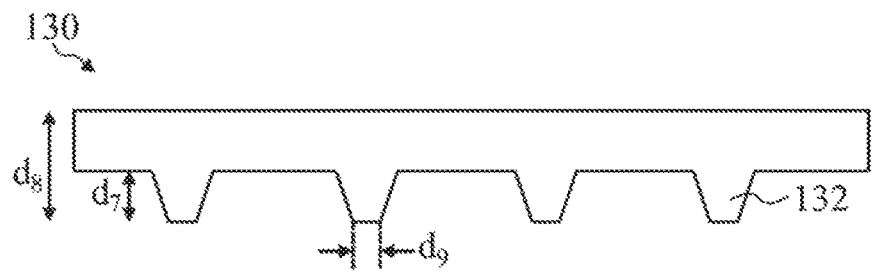
FIG. 13 is a cross-sectional view of a portion of the molding clamp at view B-B' shown in FIG. 11.

FIG. 12 is a cross-sectional view of a portion of the molding clamp 130 at view A-A' shown in FIG. 11. The downwardly extending members 132 extend from a body 154 of the clamp 130 and have a length comprising dimension $d_7$, wherein dimension $d_7$ comprises about 30% to about 70% of a thickness of the molding material 124 before removing the portion of the molding material 124 from over at least the scribe line regions 118 of the substrate 102 (see FIGS. 2 and 4). The total thickness of the molding clamp 130 including the members 132 comprises dimension $d_8$, wherein dimension $d_8$ comprises about 250 µm in some embodiments. FIG. 13 is a cross-sectional view of a portion of the molding clamp 130 at view B-B' shown in FIG. 11. The width of the downwardly extending members 132 comprises a dimension $d_9$, wherein dimension $d_9$ comprises about 30 µm or less in some embodiments, for example. Alternatively, dimensions $d_7$, $d_8$, and $d_9$ may comprise other values.

Figure 14:
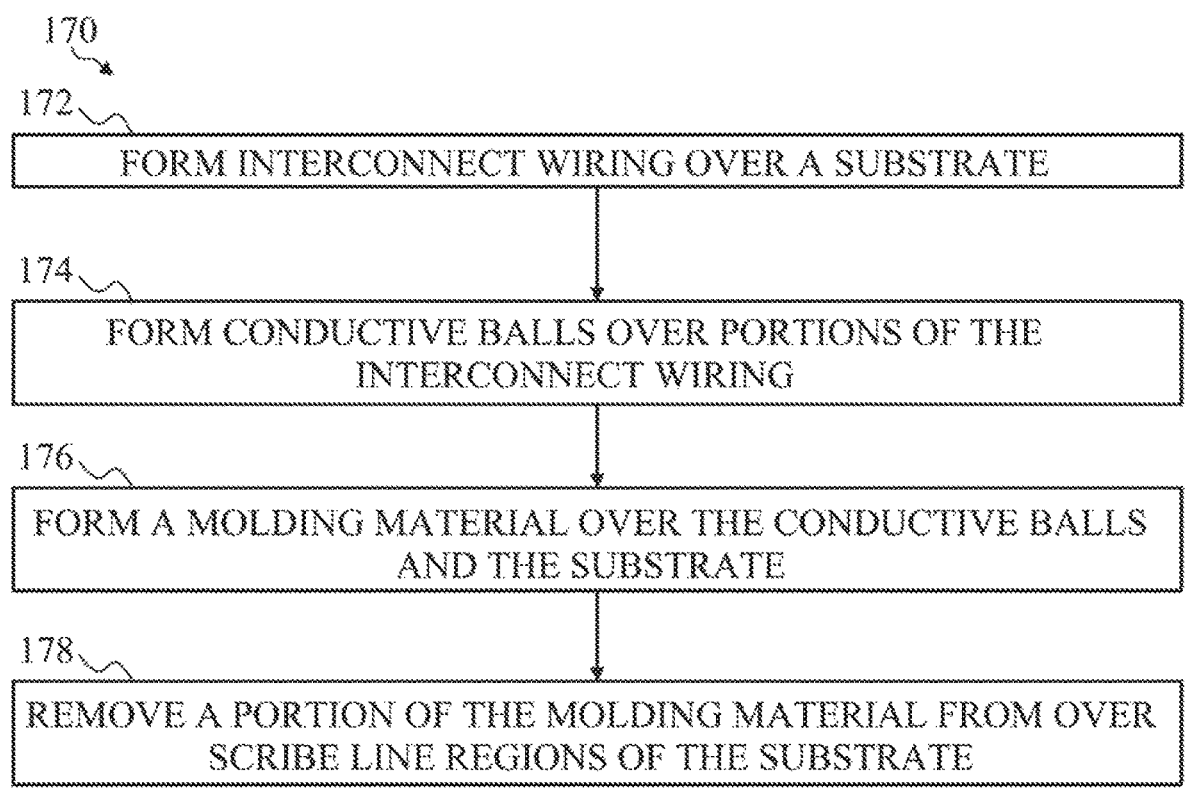
FIG. 14 is a flow chart illustrating a method of manufacturing a packaging device in accordance with some embodiments.

FIG. 14 is a flow chart 170 illustrating a method of manufacturing a packaging device 100 in accordance with some embodiments of the present disclosure. Referring also to FIG. 1, in step 172, interconnect wiring 110 is formed over a substrate 102. In step 174, conductive balls 120 are formed over portions of the interconnect wiring 110. In step 176, a molding material 124 is formed or deposited over the conductive balls 120 and the substrate 102 (see also FIG. 2). In step 178, a portion of the molding material 124 is removed from over scribe line regions 118 of the substrate 102 (see FIG. 4).

Some embodiments of the present disclosure include methods of manufacturing packaging devices 100. Other embodiments include packaging devices 100 manufactured using the methods described herein.

Advantages of some embodiments of the disclosure include providing novel packaging devices 100 that have recesses in the molding material 124 over at least portions of scribe line regions 118, which provides a guide for a saw, laser, or other device used to singulate the packages 100 from the substrate 102. The recessed regions 134 in the molding material 124 advantageously improve the accuracy of the die saw process and singulation process by providing an alignment reference and guide for the tool used to perform the singulation, further resulting in improved assembly yields. The packaging devices 100 are formed using ultra-low cost wafer level chip scale package (WLCSP) schemes and manufacturing processes that provide a reliability improvement.

Removing or thinning the molding material 124 from over the scribe line regions 118 also allows the ability to inspect the packaging devices 100 for cracks, delamination, and/or voids. Infrared (IR) or other types of inspection may be automatically implemented in a production line to quickly inspect the packaging devices 100 at the scribe line region 118 through the thinned molding compound 124. Such inspections may be performed at speeds of about 1 to 2 seconds per package 100, as an example. Furthermore, removing or thinning the molding material 124 in the scribe line regions 118 prevents heat absorption in the molding material 124 in the scribe line regions 118 during the singulation process, particularly when a laser saw is used for singulation, which prevents reliability problems, e.g., from overheating of the molding material 124.

In addition, the novel packaging device 100 structures and designs are easily implementable in manufacturing process flows. The manufacturing methods for the packaging devices 100 can be implemented with no additional costs, and ensure a robust wafer level packaging scheme.

In accordance with some embodiments of the present disclosure, a method of manufacturing a packaging device includes forming an interconnect wiring over a substrate, forming a plurality of conductive balls over portions of the interconnect wiring, and depositing a molding material over the plurality of conductive balls and the substrate. A portion of the molding material is removed from over scribe line regions of the substrate.

In accordance with other embodiments, a method of manufacturing a packaging device includes forming a plurality of contact pads over a substrate, the substrate including a plurality of seal ring regions and a plurality of scribe line regions. A passivation layer is formed over the substrate and over a first portion of each of the plurality of contact pads yet leaving a second portion of each of the plurality of contact pads exposed. A plurality of PPI lines is formed over the passivation layer, wherein each of the plurality of PPI lines is coupled to a second portion of one of the plurality of contact pads. A plurality of PPI pads is formed over the passivation layer, wherein each of the plurality of PPI pads is coupled to one of the plurality of PPI lines. The method includes coupling a conductive ball over each of the plurality of PPI pads, and depositing a molding material over the plurality of conductive balls, the plurality of PPI lines, and the passivation layer. The molding material is cured. A first portion of the molding material is removed from over portions of the plurality of seal ring regions and the plurality of scribe line regions. A second portion of the molding material is removed from over the plurality of conductive balls, the first portion of the molding material being greater than the second portion. The substrate is singulated along the plurality of scribe line regions.

In accordance with other embodiments, a packaging device includes a plurality of contact pads disposed over a substrate. The substrate includes a seal ring region disposed proximate a perimeter thereof. A passivation layer is disposed over the substrate and over a first portion of the plurality of contact pads. A plurality of PPI lines is disposed over the passivation layer, wherein each of the plurality of PPI lines is coupled to a second portion of one of the plurality of contact pads. A plurality of PPI pads is disposed over the passivation layer, wherein each of the plurality of PPI pads is coupled to one of the plurality of PPI lines. A conductive ball is coupled to each of the plurality of PPI pads. A molding material is disposed between the conductive balls, over the PPI lines, and over the passivation layer. The molding material comprises a first thickness over the seal ring region and a second thickness proximate the conductive balls, the second thickness being greater than the first thickness.

In accordance with embodiments, a packaging device includes a plurality of contact pads disposed over a substrate, the substrate including a seal ring region disposed proximate a perimeter thereof. A passivation layer is disposed over the substrate and over a first portion of the plurality of contact pads. A plurality of post passivation interconnect (PPI) lines is disposed over the passivation layer, each of the plurality of PPI lines being coupled to a second portion of one of the plurality of contact pads. A plurality of PPI pads is disposed over the passivation layer, each of the plurality of PPI pads being coupled to one of the plurality of PPI lines. A conductive ball is coupled to each of the plurality of PPI pads. A molding material is disposed between the conductive balls, over the PPI lines, and over the passivation layer. The molding material includes a first thickness over the seal ring region and a second thickness proximate the conductive balls, the second thickness being greater than the first thickness.

In accordance with other embodiments, a packaging device includes a plurality of contact pads disposed over a substrate. The substrate includes a plurality of seal ring regions and a plurality of scribe line regions. A passivation layer is disposed over the substrate and over a first portion of each of the plurality of contact pads. A second portion of each of the plurality of contact pads is exposed. A plurality of post passivation interconnect (PPI) lines is disposed over the passivation layer. Each of the plurality of PPI lines is coupled to the second portion of a respective one of the plurality of contact pads. A plurality of PPI pads is disposed over the passivation layer. Each of the plurality of PPI pads is coupled to a respective one of the plurality of PPI lines. A plurality of conductive balls is coupled to respective ones of the plurality of PPI pads. A molding material is disposed over the substrate and between the conductive balls. The molding material includes a first thickness over the plurality of seal ring regions and a second thickness proximate the plurality of conductive balls, the second thickness being greater than the first thickness.

In accordance with other embodiments, a packaging device includes a contact pad disposed over a substrate. A passivation layer is disposed over the substrate and over a first portion of the contact pad. A seal ring is disposed in a seal ring region proximate a perimeter of the substrate. Interconnect wiring is disposed over the passivation layer and is coupled to a second portion of the contact pad. A conductive ball is coupled to the interconnect wiring. A molding material is disposed over the substrate. The molding material includes a first portion around the conductive ball and over the interconnect wiring and a second portion over the seal ring region. A thickness of the first portion is greater than a thickness of the second portion.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A packaging device comprising:
   a contact pad over a circuit region of a substrate, the substrate comprising a seal ring proximate a perimeter of the circuit region;
   a passivation layer over the substrate and over a first portion of the contact pad;
   a post passivation interconnect (PPI) structure over the passivation layer, wherein the PPI structure is coupled to a second portion of the contact pad;
   a conductive ball coupled to the PPI structure; and
   a molding material around the conductive ball, over the PPI structure, and over the passivation layer, wherein the molding material comprises a first thickness directly over the seal ring and a second thickness proximate the conductive ball, the second thickness being greater than the first thickness.

2. The package device of claim 1, wherein the molding material comprises:
   a first upper surface directly over the seal ring;
   a second upper surface proximate the conductive ball; and
   a slanted sidewall connecting the first upper surface and the second upper surface.

3. The package device of claim 1, wherein the conductive ball extends above an uppermost surface of the molding material.

4. The package device of claim 1, wherein the first thickness is about 30 µm or less.

5. The package device of claim 1, wherein the seal ring extends from a first surface of the passivation layer distal the substrate to a second surface of the passivation layer opposing the first surface.

6. The package device of claim 5, wherein the seal ring further extends into the substrate.

7. The package device of claim 1, wherein the substrate further comprises a scribe line region adjacent to the seal ring, with the seal ring disposed between the circuit region and the scribe line region, wherein the molding material extends over the scribe line region.

8. The package device of claim 7, wherein the molding material has a same thickness over the scribe line region and over the seal ring.

9. The package device of claim 7, wherein the molding material has a third thickness over the scribe line region, the third thickness being different from the first thickness.

10. The package device of claim 9, wherein the first thickness is smaller than the third thickness, and the third thickness is smaller than the second thickness.

11. A packaging device comprising:
a substrate having a circuit region and a seal ring around the circuit region;
a first dielectric layer over the substrate, the circuit region, and the seal ring;
a redistribution layer over the first dielectric layer and electrically couple to the circuit region;
a conductive ball over the redistribution layer and electrically coupled to the redistribution layer; and
a molding material over the redistribution layer and around the conductive ball, the molding material covering at least a first region of an upper surface of the first dielectric layer, the first region disposed directly over the circuit region, wherein a second region of the upper surface of the first dielectric layer is exposed by the molding material, the second region disposed directly over the seal ring.

12. The package device of claim 11, wherein the molding material has a slanted sidewall between an upper surface of the molding material and a lower surface of the molding material.

13. The package device of claim 11, wherein a third region of the upper surface of the first dielectric layer is disposed directly over the circuit region, and is between the first region and the second region, wherein the third region is also exposed by the molding material.

14. The package device of claim 11, wherein the substrate further comprises a scribe line region around the seal ring, wherein the scribe line region is exposed by the molding material.

15. The packaging device of claim 11, wherein the conductive ball extends beyond a surface of the molding material by about 80 µm to about 120 µm.

16. A packaging device comprising:
a contact pad over a circuit region of a substrate;
a seal ring in the substrate and around a perimeter of the circuit region;
a first dielectric layer over the contact pad, the seal ring, and the substrate;
a post passivation interconnect (PPI) structure extending through the first dielectric layer and electrically coupled to the contact pad;
a conductive ball electrically coupled to the PPI structure; and
a molding material over the first dielectric layer, over the PPI structure, and around the conductive ball, wherein the molding material has a first thickness proximate the conductive ball and a second thickness directly over the seal ring, the first thickness being larger than the second thickness.

17. The packaging device of claim 16, further comprising a passivation layer between the substrate and the first dielectric layer, wherein the PPI structure extends through the passivation layer to electrically couple to the contact pad.

18. The packaging device of claim 16, wherein the conductive ball extends further from the substrate than an uppermost surface of the molding material.

19. The packaging device of claim 16, wherein a first sidewall of the molding material is perpendicular to an upper surface of the first dielectric layer, and a second sidewall of the molding material is sloped with respect to the upper surface of the first dielectric layer.

20. The packaging device of claim 16, wherein the substrate further comprises a scribe line region around the seal ring, wherein the molding material extends over the scribe line region and has the second thickness over the scribe line region.

* * * * *